United States Patent
Kang et al.

(10) Patent No.: US 8,867,882 B2
(45) Date of Patent: Oct. 21, 2014

(54) OPTICAL INPUT/OUTPUT DEVICE FOR PHOTO-ELECTRIC INTEGRATED CIRCUIT DEVICE AND METHOD OF FABRICATING SAME

(71) Applicant: Samsung Electronics Co., Ltd., Suwon-si (KR)

(72) Inventors: Pil-Kyu Kang, Anyang-si (KR); Dae Lok Bae, Seoul (KR); Gil Heyun Choi, Seoul (KR); Jong Myeong Lee, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/840,466

(22) Filed: Mar. 15, 2013

(65) Prior Publication Data

US 2013/0224935 A1    Aug. 29, 2013

Related U.S. Application Data

(62) Division of application No. 12/968,488, filed on Dec. 15, 2010, now Pat. No. 8,422,845.

(30) Foreign Application Priority Data

Feb. 4, 2010    (KR) .......................... 10-2010-0010457

(51) Int. Cl.
*G02B 6/00*    (2006.01)
*G02B 6/02*    (2006.01)
*H01L 21/762*    (2006.01)

(52) U.S. Cl.
CPC .............. *H01L 21/7624* (2013.01); *G02B 6/02* (2013.01)

USPC .............................. 385/131; 385/14; 385/129

(58) Field of Classification Search
USPC .............. 385/14, 31, 125, 129, 130, 131, 132
See application file for complete search history.

(56) References Cited

U.S. PATENT DOCUMENTS

| | | | |
|---|---|---|---|
| 6,925,216 | B2 | 8/2005 | Vernon et al. |
| 7,116,880 | B1 | 10/2006 | Liu et al. |
| 2006/0159411 | A1 | 7/2006 | Miller |
| 2007/0047886 | A1 | 3/2007 | Gorczyca |
| 2007/0086719 | A1 | 4/2007 | Takahashi et al. |
| 2007/0101927 | A1 | 5/2007 | Keyser et al. |
| 2007/0147762 | A1 | 6/2007 | Kwakemaak et al. |
| 2007/0211992 | A1 | 9/2007 | Chu et al. |
| 2011/0133063 | A1 | 6/2011 | Ji et al. |
| 2012/0039564 | A1 | 2/2012 | Kang et al. |

FOREIGN PATENT DOCUMENTS

| | | | |
|---|---|---|---|
| DE | 19640420 A1 | * | 4/1998 |
| JP | 2007133408 A | | 5/2007 |
| KR | 100759825 B1 | | 9/2007 |

\* cited by examiner

*Primary Examiner* — Charlie Peng
*Assistant Examiner* — Mary El Shammaa
(74) *Attorney, Agent, or Firm* — Volentine & Whitt, PLLC

(57) ABSTRACT

A photo-electric integrated circuit device comprises an on-die optical input/output device. The on-die optical input/output device comprises a substrate having a trench, a lower cladding layer disposed in the trench and having an upper surface lower than an upper surface of the substrate, and a core disposed on the lower cladding layer at a distance from sidewalls of the trench and having an upper surface at substantially the same level as the upper surface of the substrate.

15 Claims, 11 Drawing Sheets

OPTICAL INPUT/OUTPUT DEVICE FOR PHOTO-ELECTRIC INTEGRATED CIRCUIT DEVICE AND METHOD OF FABRICATING SAME

CROSS-REFERENCE TO RELATED APPLICATIONS

This application is a Divisional of application Ser. No. 12/968,488, filed Dec. 15, 2010, which claims priority under 35 U.S.C. §119 to Korean Patent Application 10-2010-0010457 filed on Feb. 4, 2010, the disclosure of which is hereby incorporated by reference in its entirety.

BACKGROUND

Embodiments of the inventive concept relate generally to photo-electric integrated circuit devices. More particularly, embodiments of the inventive concept relate to on-die optical input/output devices for photo-electric integrated circuit devices and methods of fabricating the on-die optical input/output devices.

An optical device having an optical waveguide can be formed on a silicon-on-insulator (SOI) substrate. The SOI substrate typically comprises a silicon supporting layer, a silicon oxide layer, and a single crystal silicon layer. The silicon oxide layer is used as a lower cladding layer and is formed in advance below the single crystal silicon layer. The optical waveguide can be formed by etching the single crystal silicon layer of the SOI substrate through a photoresist pattern and then forming an upper cladding layer on the SOI substrate to cover a core of the optical waveguide.

The SOI substrate is typically more expensive than a bulk silicon wafer, which can limit its practical use. In addition, it can be difficult to integrate other electronic devices, such as a dynamic random access memory (DRAM), in the same substrate as the optical device formed in the SOI substrate, because the DRAM is typically formed in bulk silicon. Consequently, other electronic devices, such as the DRAM, are commonly manufactured and packaged separately from the optical device having the optical waveguide. This tends to increase the cost and time of manufacturing the optical device and the other electronic devices.

SUMMARY

Embodiments of the inventive concept provide an on-die optical input/output device for a photo-electric integrated circuit device, and a method of fabricating the on-die optical input/output device. The on-die optical input/output device and the method can improve the reliability and yield of photo-electric integrated circuit devices.

According to one embodiment of the inventive concept, an on-die optical input/output device comprises a substrate having an upper surface and a trench having sidewalls, a lower cladding layer disposed in the trench and having an upper surface lower than the upper surface of the substrate, and a core disposed on the lower cladding layer at a distance from the sidewalls of the trench and having an upper surface at substantially the same level as the upper surface of the substrate.

In certain embodiments, the core comprises single crystal silicon.

In certain embodiments, the single crystal silicon is formed by laser-induced epitaxial growth.

In certain embodiments, the substrate is a bulk silicon wafer.

In certain embodiments, the lower cladding layer comprises silicon oxide.

In certain embodiments, the on-die optical input/output device further comprises an upper cladding layer covering the core. In certain embodiments, the upper cladding layer comprises silicon oxide, silicon oxynitride, or silicon nitride.

According to another embodiment of the inventive concept, a method is provided for fabricating an on-die optical input/output device. The method comprises forming a trench in a substrate, forming a lower cladding layer in the trench, the lower cladding layer having an upper surface lower than an upper surface of the substrate, and forming a core on the lower cladding layer, the core being separated from sidewalls of the trench and having an upper surface at substantially the same level as the upper surface of the substrate.

In certain embodiments, the substrate comprises a bulk silicon wafer.

In certain embodiments, forming the trench comprises forming an etching stop layer exposing a part of the upper surface of the substrate, and etching the substrate using the etching stop layer as a mask.

In certain embodiments, the etching stop layer comprises silicon nitride or silicon oxynitride.

In certain embodiments, forming the lower cladding layer comprises forming a lower cladding film that covers the upper surface of the substrate and fills the trench, planarizing the lower cladding film to expose the upper surface of the substrate, and recessing the planarized lower cladding film.

In certain embodiments, the lower cladding film comprises silicon oxide.

In certain embodiments, forming the core comprises forming a single crystal silicon layer that fills the trench in which the lower cladding layer is formed and covers the upper surface of the substrate, planarizing the single crystal silicon layer to expose the upper surface of the substrate, and selectively etching the planarized single crystal silicon layer.

In certain embodiments, forming the single crystal silicon layer comprises forming an amorphous silicon layer that fills the trench in which the lower cladding layer is formed and covers the upper surface of the substrate, planarizing the amorphous silicon layer to have a flat surface, and crystallizing the planarized amorphous silicon layer.

In certain embodiments, a portion of the amorphous silicon layer remains on the upper surface of the substrate after the amorphous silicon layer is planarized.

In certain embodiments, the planarized amorphous silicon layer is crystallized and changed into the single crystal silicon layer using a laser.

In certain embodiments, the method further comprises removing the etching stop layer after selectively etching the planarized single crystal silicon layer.

In certain embodiments, the method further comprises forming an upper cladding layer to cover the core.

In certain embodiments, the upper cladding layer comprises silicon oxide, silicon oxynitride, or silicon nitride.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Figure 1A:
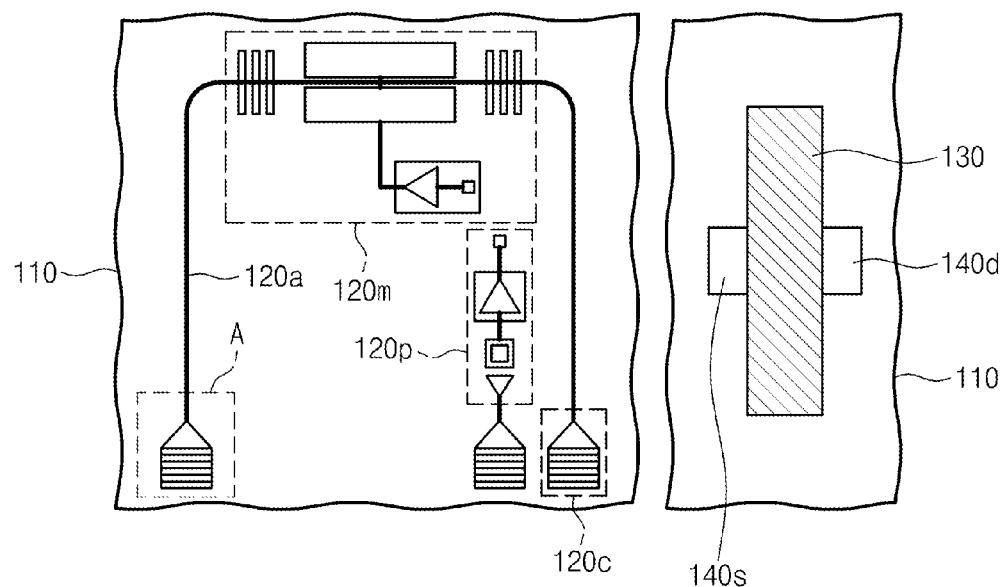
FIG. 1A is a plan view illustrating a photo-electric integrated circuit device comprising an on-die optical input/output device according to an embodiment of the inventive concept.

Embodiments of the inventive concept are described below with reference to the accompanying drawings. These embodiments are presented as teaching examples and should not be construed to limit the scope of the inventive concept.

The terminology used in this description is for the purpose of describing various embodiments and is not intended to be limiting of the embodiments. As used herein, the singular forms "a," "an," and "the" are intended to encompass the plural forms as well, unless the context clearly indicates otherwise. The terms "comprises" and/or "comprising," where used in this description, specify the presence of stated features, integers, steps, operations, elements, and/or components, but do not preclude the presence or addition of one or more other features, integers, steps, operations, elements, components, and/or groups thereof. The reference numerals used in this description are not necessarily limited to the order presented. Moreover, in this description, where a layer or other feature is referred to as being "on" another layer or feature, it may be directly on the other layer or substrate or a third intervening layer may be interposed therebetween.

Various embodiments are described with reference to cross-sectional illustrations and/or plane illustrations shown in an idealized form. The actual form of embodiments may vary from the illustrated shapes as a result of, for example, manufacturing techniques and/or tolerances. In drawings, the thickness of layers and regions is exaggerated to effectively illustrate certain technical details. Thus, example embodiments should not be construed as limited to the shapes of regions illustrated herein but are to include various deviations in shapes, including those that result from manufacturing. For instance, an etching region illustrated as a rectangle can have rounded or curved features.

Figure 1B:
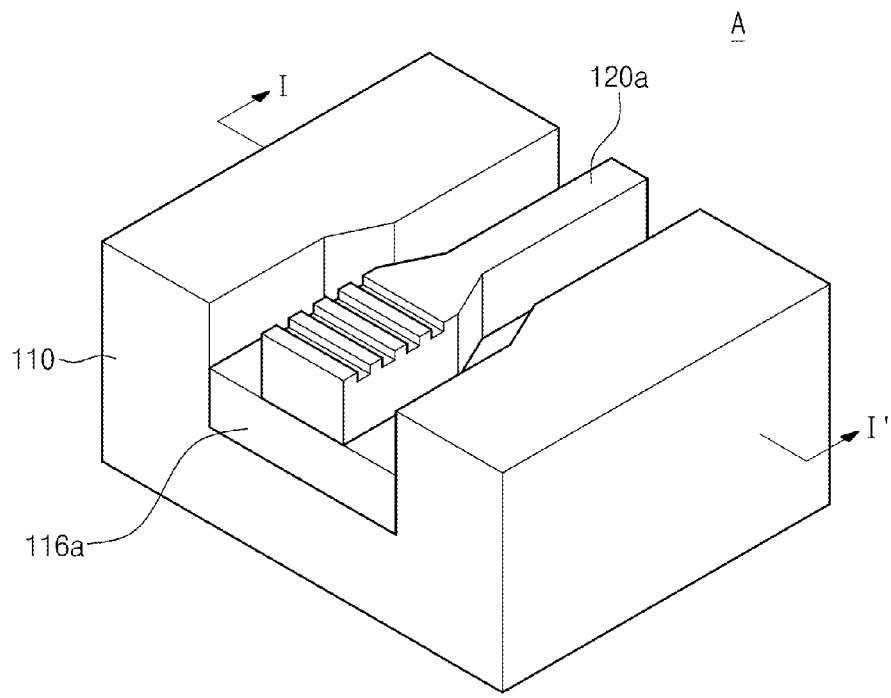
FIG. 1B is an enlarged view of a part "A" of FIG. 1A.
Figure 1C:
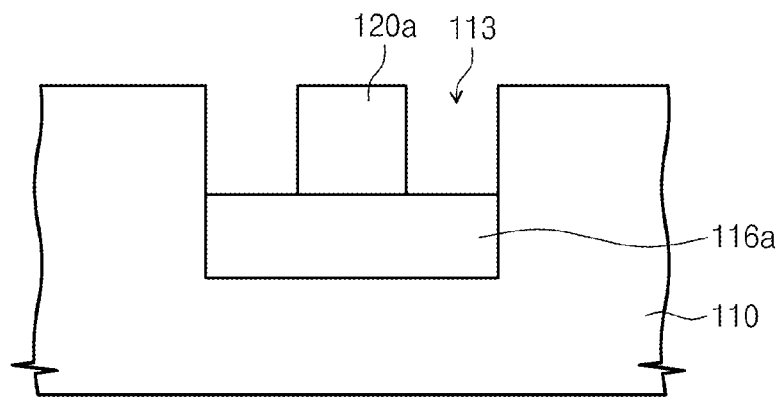
FIG. 1C is a cross-sectional view taken along a line I-I' of FIG. 1B.

FIG. 1A is a plan view illustrating a photo-electric integrated circuit device comprising an on-die optical input/output device according to an embodiment of the inventive concept. FIG. 1B is an enlarged view illustrating a part "A" of FIG. 1A. FIG. 1C is a cross-sectional view taken along a line I-I' of FIG. 1B.

Referring to FIG. 1A, the photo-electric integrated circuit device is formed in a substrate 110 containing another electronic device. In this example, the other electronic device is a DRAM cell comprising a transistor 130 having a source 140s and a drain 140d. In other examples, different electronic devices, such as different types of memory cells, could be formed in substrate 110.

The on-die optical input/output device comprises elements for executing various functions, including optical signal transmission. For instance, the on-die optical input/output device comprises a modulator 120m, a photodiode 120p, a coupler 120c, and a grating. These elements can be configured by modifying or combining various forms of optical waveguides.

Referring to FIGS. 1B and 1C, the on-die optical input/output device comprises substrate 110, a trench 113 formed in substrate 110, a lower cladding layer 116a, and a core 120a. Lower cladding layer 116a is disposed in trench 113 and has an upper surface that is lower than an upper surface of substrate 110. Core 120a has an upper surface at substantially the same level as the upper surface of substrate 110. Core 120a is disposed on lower cladding layer 116a at a distance from sidewalls of trench 113.

Substrate 110 comprises a bulk silicon wafer, and lower cladding layer 116a comprises silicon oxide ($SiO_2$). Core 120a contains single crystal silicon formed by laser-induced epitaxial growth and has a higher refractive index than lower cladding layer 116a.

Although not illustrated in FIGS. 1A through 1C, the on-die optical input/output device can further comprise an upper cladding layer 122 (see FIG. 13) covering core 120a. The upper cladding layer can contain a material having a lower refractive index than core 120a. For example, the upper cladding layer can be formed of an air layer having a lower refractive index than the single crystal silicon.

With such a configuration, lower cladding layer 116a, core 120a, and upper cladding layer 122 can form an optical waveguide in substrate 110. The optical waveguide can be formed in various planar shapes to perform functions of modulator 120m, photodiode 120p, coupler 120c, and the grating, as well as functions for transmitting an optical signal in the on-die optical input/output device.

Because core 120a has an upper surface at substantially the same level as the upper surface of substrate 110, subsequent processes for integrating memory cells into the electronic device, such as chemical mechanical polishing, can be performed without damaging the on-die optical input/output device. Accordingly, the configuration of core 120a and substrate 110 can improve the reliability of the photo-electric integrated circuit device.

In addition, the configuration of core 120a and substrate 110 can prevent a step difference from occurring in regions where the optical waveguide is coupled to features having different widths of lower cladding layer 116a, such as modulator 120m, photodiode 120p, coupler 120c, and the grating. Moreover, the configuration of core 120a and substrate 110 can prevent a difference in the thickness from occurring in the same substrate or between different substrates. These and other advantages can allow a photo-electric integrated circuit device including the on-die optical input/output device to be miniaturized at a relatively low cost, which can allow signal transmission to occur at high speeds and low power.

FIGS. 2 through 13 are cross-sectional views illustrating a method of fabricating an on-die optical input/output device according to an embodiment of the inventive concept.

Figure 2:
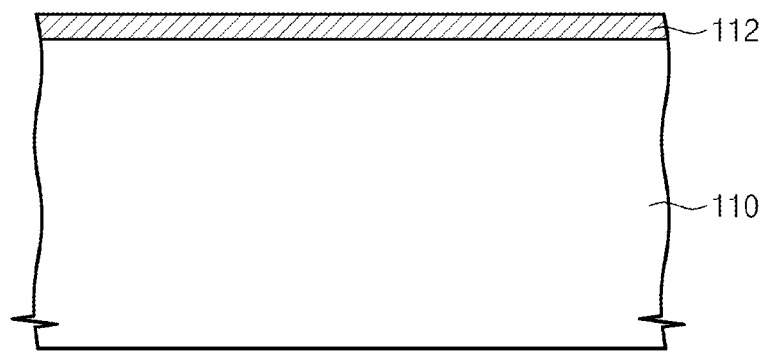
FIGS. 2 through 13 are cross-sectional views illustrating a method of fabricating an on-die optical input/output device according to an embodiment of the inventive concept.
Figure 3:
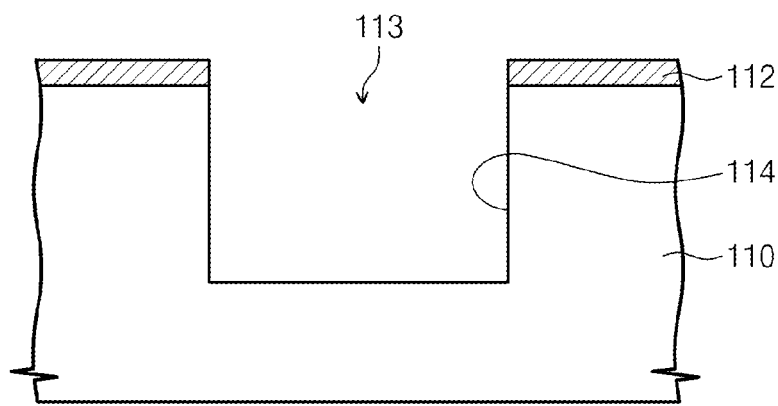

Referring to FIGS. 2 and 3, the method comprises forming an etching stop layer 112 on a substrate 110. In this example, substrate 110 comprises a bulk silicon wafer, and etching stop layer 112 comprises a material having a high etching selectivity relative to substrate 110. For instance, in some embodiments, etching stop layer 112 comprises silicon nitride (SiN) or silicon oxynitride (SiON).

The method further comprises etching etching stop layer 112 to expose a part of substrate 110, and then etching substrate 110, using etching stop layer 112 as a mask, to form trench 113 with sidewalls 114.

Figure 4:
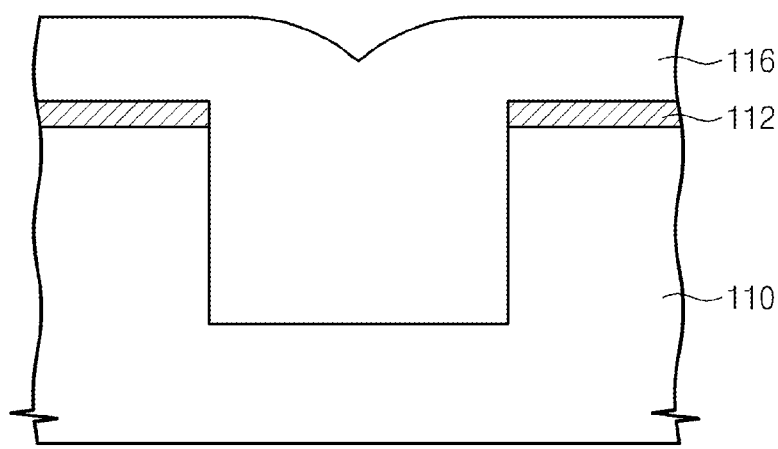
Figure 5:
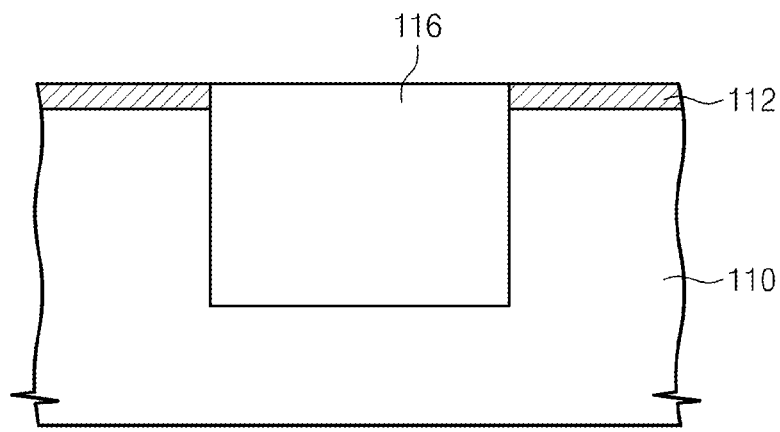

Referring to FIGS. 4 and 5, the method further comprises forming a lower cladding film 116 that fills trench 113 and covers substrate 110 and etching stop layer 112. Lower cladding film 116 comprises a material having a refractive index lower than that of core 120a formed in a subsequent process. In some embodiments, lower cladding film 116 comprises silicon oxide.

The method further comprises planarizing lower cladding film 116 to expose etching stop layer 112. Lower cladding film 116 can be planarized, for example, by chemical mechanical polishing. Etching stop layer 112 indicates an end point of the chemical mechanical polishing of lower cladding film 116.

Figure 6:
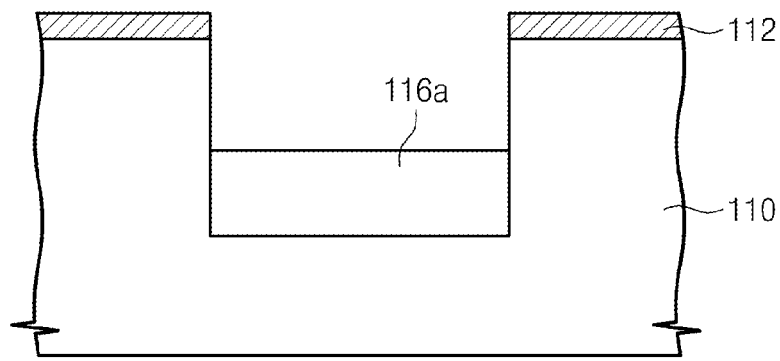

Referring to FIG. 6, the method further comprises recessing the planarized lower cladding film 116 by etching, using etching stop layer 112 as a mask. This forms lower cladding layer 116a in trench 113 with an upper surface lower than the upper surface of substrate 110.

Figure 7:
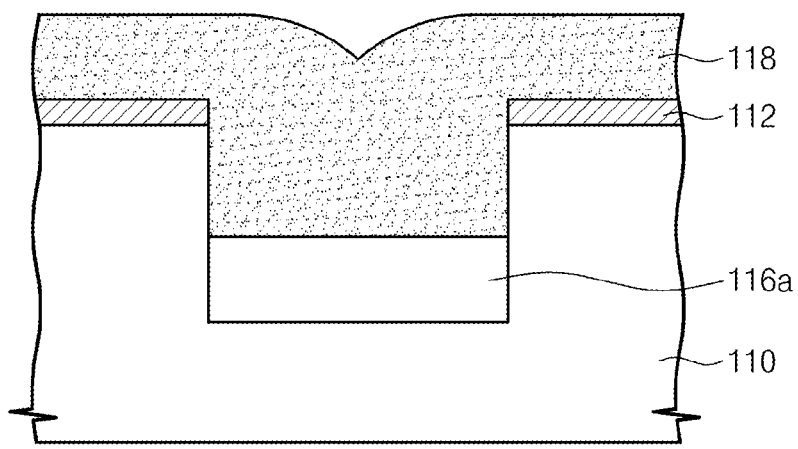
Figure 8:
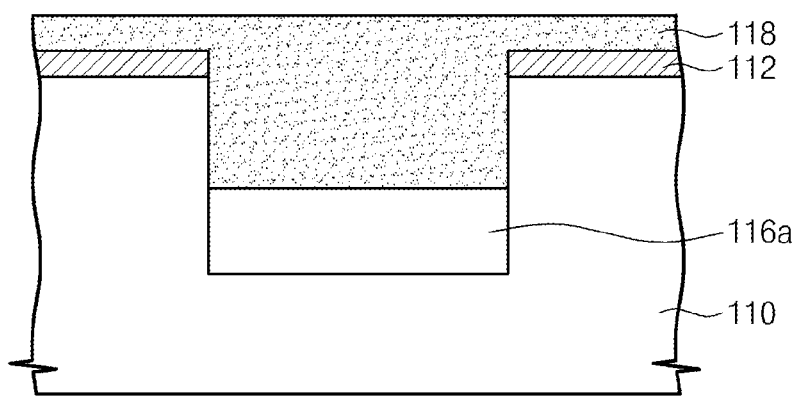

Referring to FIGS. 7 and 8, the method further comprises forming an amorphous silicon layer 118 that fills trench 113 and covers substrate 110 and etching stop layer 112, and further comprises planarizing amorphous silicon layer 118 to have a flat surface.

Amorphous silicon layer 118 can be planarized by partial chemical mechanical polishing. Consequently, a portion of amorphous silicon layer 118 can remain on etching stop layer 112. The portion of amorphous silicon layer 118 that remains on etching stop layer 112 serves as an energy absorbing layer to minimize various forms of damage that occur in a subsequent process for crystallizing amorphous silicon layer 118, such as deformation of substrate 110 and etching stop layer 112.

Figure 9:
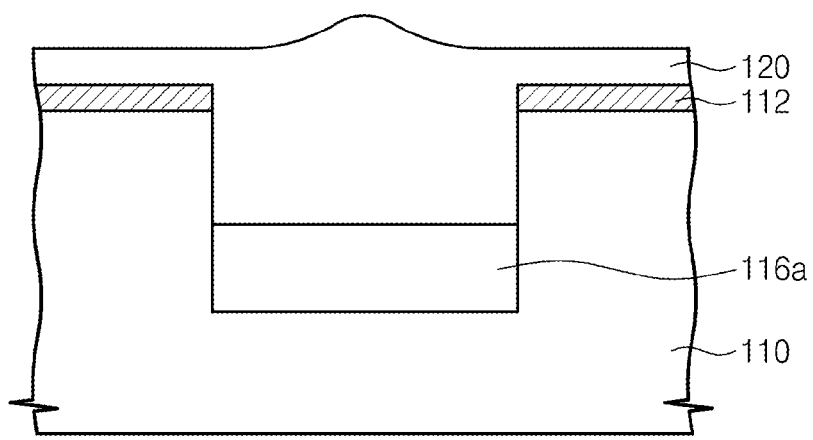
Figure 10:
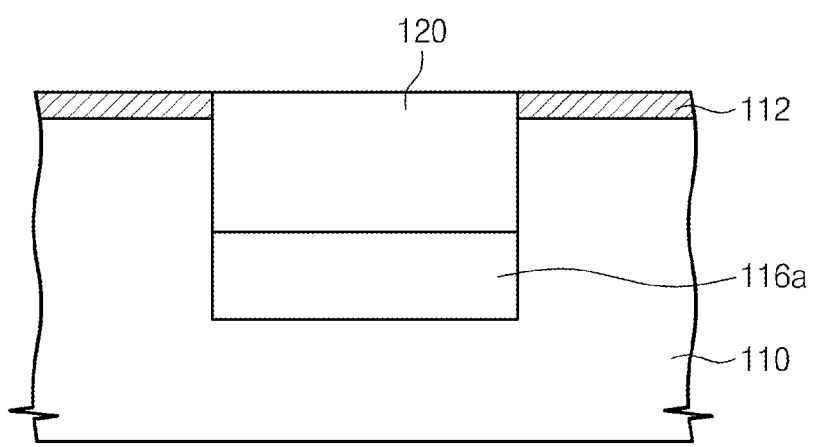

Referring to FIGS. 9 and 10, the method further comprises forming a single crystal silicon layer 120 in trench 113 by crystallizing the planarized amorphous silicon layer 118 and then planarizing single crystal silicon layer 120.

The planarized amorphous silicon layer 118 is changed into single crystal silicon layer 120 using a laser. In other words, single crystal silicon layer 120 is formed by laser-induced epitaxial growth.

Single crystal silicon layer 120 is planarized by chemical mechanical polishing, and etching stop layer 112 indicates an end point of the chemical mechanical polishing. By indicating the end point of the chemical mechanical polishing, etching stop layer 112 improves the uniformity of the thickness of single crystal silicon layer 120 and substrate 110.

Figure 11:
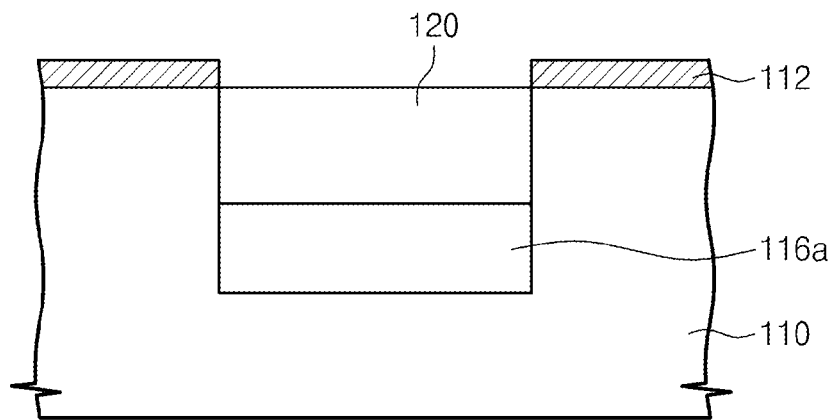

Referring to FIG. 11, the method further comprises etching single crystal silicon layer 120, using etching stop layer 112 as a mask, such that the upper surface of single crystal silicon layer 120 is at substantially the same level as the upper surface of substrate 110.

Figure 12:
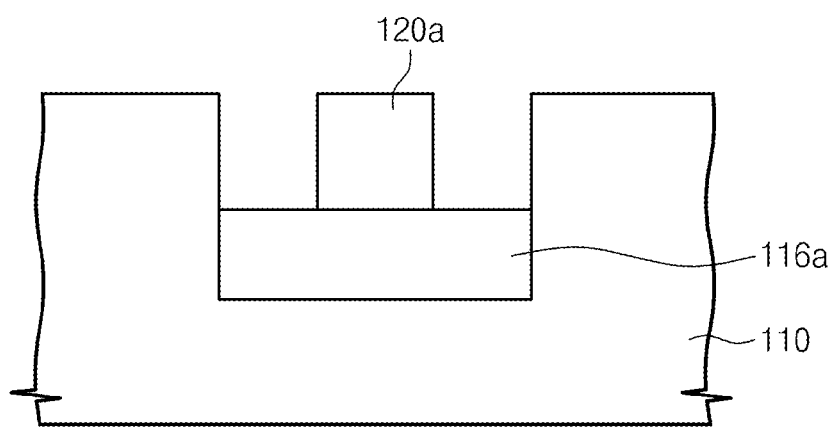

Referring to FIG. 12, the method further comprises selectively etching single crystal silicon layer 120 to form core 120a on lower cladding layer 116a, and then removing etching stop layer 112. Core 120a is formed at a distance from sidewalls 114 of trench 113 and has an upper surface at substantially the same level as the upper surface of substrate 110.

Because single crystal silicon layer 120 is formed in trench 113, there is a clear boundary between substrate 110 and single crystal silicon layer 120, and etching stop layer 112 remains on the surface of substrate 110 but not on single crystal silicon layer 120. Consequently, it is possible to prevent damage to an active surface of substrate 110 during the process of etching single crystal silicon layer 120 to form core 120a.

Figure 13:
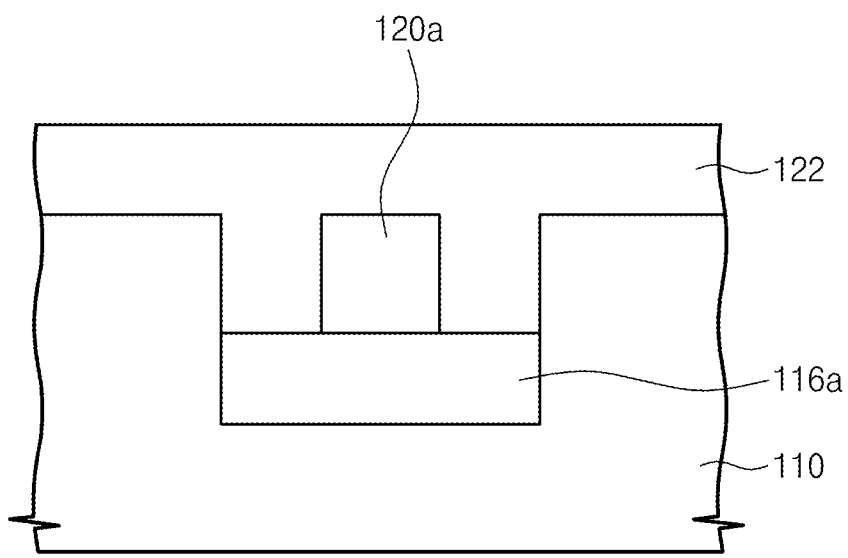

Referring to FIG. 13, the method further comprises forming upper cladding layer 122 to cover core 120a. Upper cladding layer 122 comprises a material having a refractive index lower than that of core 120a. Upper cladding layer 122 typically comprises silicon oxide, silicon oxynitride, or silicon nitride.

Together, lower cladding layer 116a, core 120a, and upper cladding layer 122 form the optical waveguide in substrate 110. The optical waveguide can be formed in various planar shapes and can execute functions such as the functions of modulator 120m, photodiode 120p, coupler 120c, and the grating, as well as functions for transmitting optical signals in the on-die optical input/output device.

Alternatively, because air has a refractive index lower than that of core 120a, upper cladding layer 122 can be omitted. Alternatively, upper cladding layer 122 can be substituted by a layer such as an inter-layer insulating layer formed in a subsequent process for forming memory cells of an electronic device.

In the on-die optical input/output device formed according to the method of FIGS. 2 through 13, core 120a is formed with an upper surface having substantially the same level as that of the surface of substrate 110. This configuration can prevent the on-die optical input/output device from being damaged in subsequent processes used to form additional features, such as chemical mechanical polishing. Thus, the configuration can improve the yield of the photo-electric integrated circuit device.

The configuration of core 120a and substrate 110 can also prevent a step difference from occurring in regions where the optical waveguide is coupled to features having different widths of lower cladding layer 116a, such as modulator 120m, photodiode 120p, coupler 120c, and the grating. Moreover, the configuration of core 120a and substrate 110 can prevent a difference in the thickness from occurring in the same substrate or between different substrates. These and other advantages can allow photo-electric integrated circuit device including the on-die optical input/output device to be miniaturized at a relatively low cost, which can allow signal transmission to occur at high speeds and low power.

Figure 14:
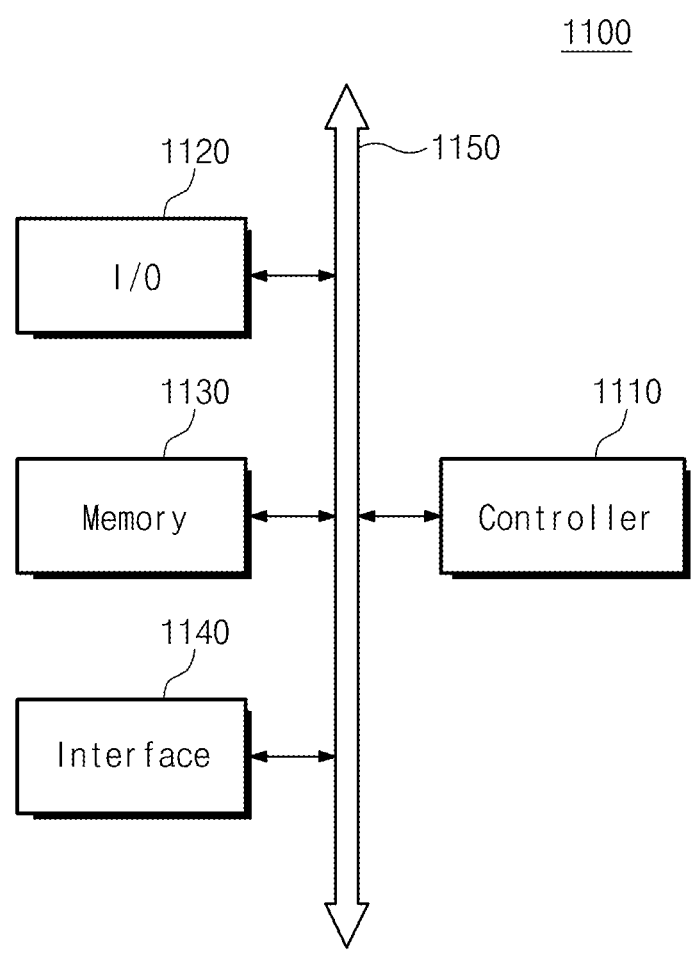
FIG. 14 is a block diagram of a memory system incorporating a memory device comprising the on-die optical input/output device of FIG. 1A according to an embodiment of the inventive concept.

FIG. 14 is a block diagram of a memory system 1100 incorporating a memory device comprising the on-die optical input/output device of FIGS. 1A through 13 according to an embodiment of the inventive concept. Memory system 1100 can comprise, for instance, a personal digital assistant, a portable computer, a web tablet, a wireless phone, a mobile phone, a digital music player, a memory card, or any electronic device capable of transmitting and/or receiving information in a wireless environment.

Referring to FIG. 14, memory system 1100 comprises a controller 1110, an external input/output (I/O) device 1120 such as a key pad, a key board, or a display device, a memory device 1130, an interface 1140, and a bus 1150. Memory device 1130 and interface 1140 communicate with each other via bus 1150.

Controller 1110 comprises at least one of a microprocessor, a digital signal processor, a microcontroller, and one or more logic units capable of carrying out similar functions. Memory device 1130 stores commands executed by controller 1110. External I/O device 1120 receives data or signals from an external source or outputs data or signals to an external destination. Examples of external I/O device 1120 include a keypad, a keyboard, and a display device.

Memory device 1130 comprises a memory device having an optical input/output device such as that described with reference to FIGS. 1A through 13. Memory device 1130 can further comprise a volatile memory or one of various other types of memories.

Interface 1140 transmits data to a communication network and receives data from the communication network.

Figure 15:
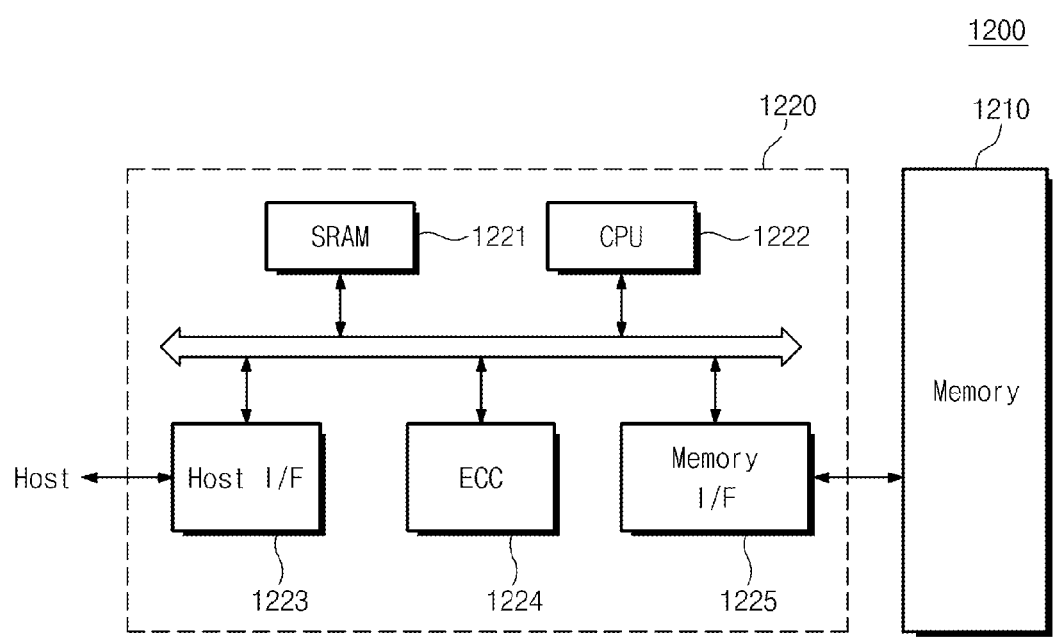
FIG. 15 is a block diagram of a memory card incorporating a memory device comprising the on-die optical input/output device of FIG. 1A according to an embodiment of the inventive concept.

FIG. 15 is a block diagram of a memory card 1200 incorporating a memory device comprising the on-die optical input/output device of FIGS. 1A through 13 according to an embodiment of the inventive concept.

Referring to FIG. 15, memory card 1200 comprises a memory device 1210 comprising the optical input/output device of FIGS. 1A through 13. Memory card 1200 further comprises a memory controller 1220 that controls data exchange between a host and memory device 1210.

Memory controller 1220 comprises a static random access memory (SRAM) 1221, a central processing unit (CPU) 1222, a host interface (I/F) 1223, an error correction coding (ECC) block 1224, and a memory interface (I/F) 1225. SRAM 1221 is used as a working memory of CPU 1222. Host I/F 1223 implements a protocol for exchanging data between memory card 1200 and the host. ECC block 1224 detects and corrects errors in multi-bit data read from memory device 1210. Memory I/F 1225 interfaces with memory device 1210. CPU 1222 executes general control operations of memory controller 1220. Although not illustrated, memory card 1200 can further comprise a ROM device storing code data for interfacing with the host.

The on-die optical input/output device of FIGS. 1A through 13 can be used to form memory card 1200 or memory system 1100 in a highly integrated manner. The on-die optical input/output device can also be used to form a memory system such as a solid state drive device with relatively high performance.

Figure 16:
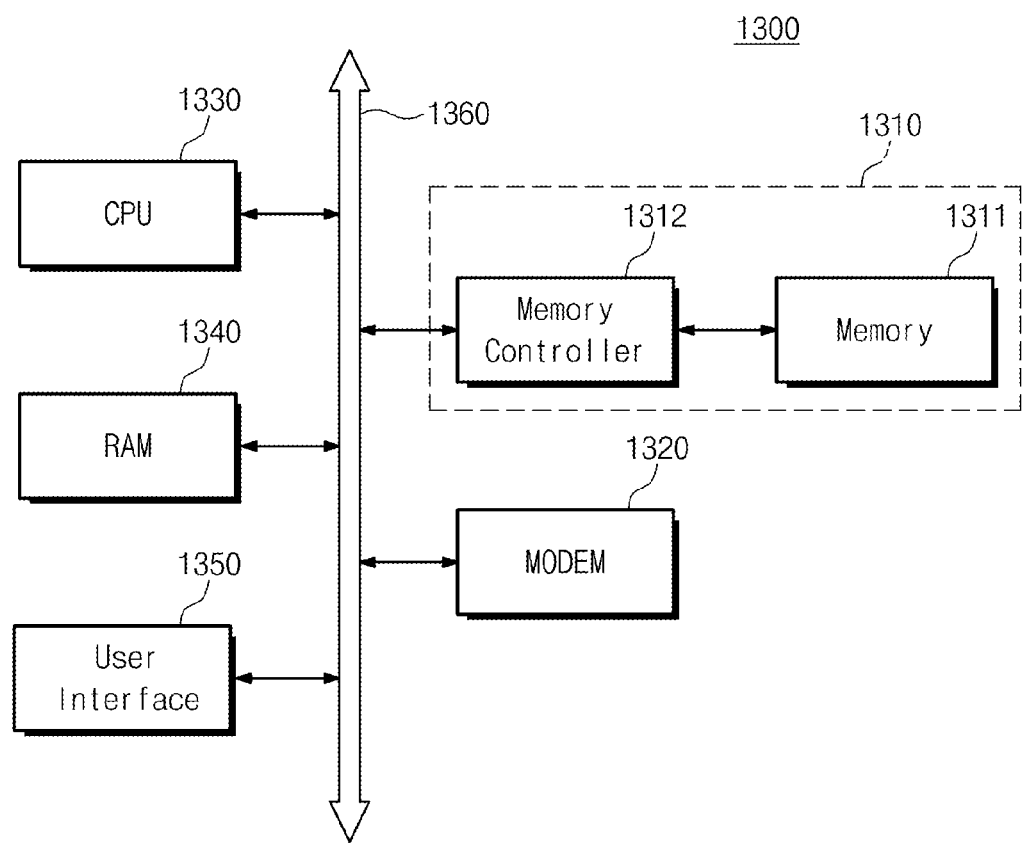
FIG. 16 is a schematic block diagram illustrating an information processing system incorporating a memory device comprising the on-die optical input/output device of FIG. 1A according to an embodiment of the inventive concept.

FIG. 16 is a block diagram illustrating an information processing system 1300 incorporating a memory device comprising the on-die optical input/output device of FIGS. 1A through 13 according to an embodiment of the inventive concept.

Referring to FIG. 16, a memory system 1310 is mounted in information processing system 1300, which can comprise, for instance, a mobile device or a desktop computer. Memory system 1310 comprises a memory device 1311 comprising the on-die optical input/output device of FIGS. 1A through 13 and a memory controller 1312 that controls data exchange between a system bus 1360 and memory device 1311.

Information processing system 1300 comprises a modulator/demodulator (MODEM) 1320, a CPU 1330, a RAM 1340, and a user interface 1350 electrically connected to memory system 1310 via system bus 1360. Memory system 1310 can have substantially the same configuration as memory system 1100.

Memory system 1310 stores data that has been processed by CPU 1330 or data received from an external source. In some embodiments memory system 1310 comprises a high capacity SSD. Moreover, in some embodiments, memory system 1310 comprises resources for performing error correction that can improve the reliability of stored data while allowing high-speed data exchange in information processing system 1300.

Although not illustrated, information processing system 1300 can further comprise other features, such as an application chipset, a camera image processor (CIS), or an external input/output device.

The above described memory devices and memory systems can be implemented in a variety of package configurations. For example, the memory devices or the memory systems can be packaged in configurations such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline (TSOP), system in package (SIP), multi-chip package (MCP), wafer-level fabricated package (WFP), or wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of fabricating an on-die optical input/output device, comprising:
   forming a trench in a substrate;
   forming a lower cladding layer in the trench, the lower cladding layer having an upper surface lower than an upper surface of the substrate; and
   forming a core on the lower cladding layer, the core being separated from sidewalls of the trench and having an upper surface at substantially the same level as the upper surface of the substrate,
   wherein forming the core comprises:
   forming a single crystal silicon layer that fills the trench in which the lower cladding layer is formed and covers the upper surface of the substrate;
   planarizing the single crystal silicon layer to expose the upper surface of the substrate; and
   selectively etching the planarized single crystal silicon layer.

2. The method of claim 1, wherein the substrate comprises a bulk silicon wafer.

3. The method of claim 1, wherein forming the trench comprises:
   forming an etching stop layer exposing a part of the upper surface of the substrate; and
   etching the substrate using the etching stop layer as a mask.

4. The method of claim 3, wherein the etching stop layer comprises silicon nitride or silicon oxynitride.

5. The method of claim 1, wherein forming the lower cladding layer comprises:
   forming a lower cladding film that covers the upper surface of the substrate and fills the trench;
   planarizing the lower cladding film to expose the upper surface of the substrate; and
   recessing the planarized lower cladding film.

6. The method of claim 5, wherein the lower cladding film comprises silicon oxide.

7. The method of claim 1, wherein forming the single crystal silicon layer comprises:
   forming an amorphous silicon layer that fills the trench in which the lower cladding layer is formed and covers the upper surface of the substrate;
   planarizing the amorphous silicon layer to have a flat surface; and
   crystallizing the planarized amorphous silicon layer.

8. The method of claim 7, wherein a portion of the amorphous silicon layer remains on the upper surface of the substrate after the amorphous silicon layer is planarized.

9. The method of claim 7, wherein the planarized amorphous silicon layer is crystallized and changed into the single crystal silicon layer using a laser.

10. The method of claim 1, further comprising removing the etching stop layer after selectively etching the planarized single crystal silicon layer.

11. The method of claim 1, further comprising forming an upper cladding layer to cover the core.

12. The method of claim 11, wherein the upper cladding layer comprises silicon oxide, silicon oxynitride, or silicon nitride.

13. A method of fabricating an on-die optical input/output device, comprising:
   forming a trench in a substrate, wherein the trench extends into the substrate from an upper surface of the substrate and has opposite sides defined by inner sidewall surfaces of the substrate, respectively;
   forming a lower cladding layer in a bottom portion of the trench such that the uppermost surface of the lower cladding layer is beneath the level of the upper surface of the substrate; and
   forming a core on the lower cladding layer within the trench, the core being spaced from said inner sidewall surfaces of the substrate, and the core having an uppermost surface disposed at substantially the same level as the upper surface of the substrate,
   wherein forming the lower cladding layer comprises forming a cladding film on the substrate and which occupies a lower portion only of the trench, and
   wherein the cladding film has a lower refractive index than the core, and
   forming the core comprises forming a layer of core material on the film within the trench to fill what remains of the trench, and patterning the layer of core material to form a patterned core having opposite sidewall surfaces each of which faces towards and is spaced from a respective one of the inner sidewall surfaces of the substrate.

14. The method of claim 13, wherein the substrate is a bulk silicon wafer and forming the trench comprises selectively removing part of the bulk silicon wafer.

15. The method of claim 14, wherein forming the lower cladding layer comprises forming the cladding film, comprising silicon, directly on the bulk silicon wafer.

* * * * *